(12) United States Patent  (10) Patent No.: US 8,260,240 B2
Malkemes et al.  (45) Date of Patent: Sep. 4, 2012

(54) SINGLE PATH ARCHITECTURE AND AUTOMATIC GAIN CONTROL (SAGC) ALGORITHM FOR LOW POWER SDARS RECEIVERS

(75) Inventors: Robert Malkemes, Bricktown, NJ (US); Denis Orlando, Freehold, NJ (US); Jie Song, Howell, NJ (US); Eric Zhong, East Brunswick, NJ (US)

(73) Assignee: Agere Systems Inc., Allentown, PA (US)

( * ) Notice: Subject to any disclaimer, the term of this patent is extended or adjusted under 35 U.S.C. 154(b) by 1225 days.

(21) Appl. No.: 11/204,631

(22) Filed: Aug. 16, 2005

(65) Prior Publication Data

US 2007/0041481 A1 Feb. 22, 2007

(51) Int. Cl.
*H04B 1/06* (2006.01)
(52) U.S. Cl. ............... 455/245.1; 455/130; 375/345
(58) Field of Classification Search ............ 455/130, 455/245.1; 375/345
See application file for complete search history.

(56) References Cited

U.S. PATENT DOCUMENTS

| | | | |
|---|---|---|---|
| 3,167,614 A * | 1/1965 | Holt et al. | 381/16 |
| 3,748,581 A * | 7/1973 | Yello | 455/144 |
| 5,541,963 A * | 7/1996 | Nakagoshi | 375/347 |
| 5,848,265 A * | 12/1998 | Maas et al. | 713/500 |
| 6,225,928 B1 * | 5/2001 | Green | 341/143 |
| 6,618,367 B1 | 9/2003 | Riazi et al. | 370/347 |
| 2004/0214540 A1 * | 10/2004 | Dockemeyer et al. | 455/182.1 |

OTHER PUBLICATIONS

U.S. Appl. No. 11/133,538, filed May 20, 2005, Y. Lai.

* cited by examiner

*Primary Examiner* — Edward Urban
*Assistant Examiner* — Hsin-Chun Liao
(74) *Attorney, Agent, or Firm* — Ryan, Mason & Lewis, LLP

(57) ABSTRACT

An automatic gain control (AGC) for use in a digital radio receiver that allows at least two types of input signal to be processed using a single receiver front end by supporting two modes of operation, each optimized for one particular signal type, and a third mode not optimized for either. The AGC enables smooth switching between the optimized modes of operation via the non-optimized mode. By measuring a difference in the strength between the demodulated signals, and comparing that to two preset values, the AGC controls which mode of operation to place the receiver in. Modes of operation are maintained by adjusting the gain of a variable gain amplifier (VGA), so that an appropriate incoming signal is amplified to a level that is suitable for an analogue-to-digital (ADC) converter. The AGC is compatible with existing satellite digital audio radio system (SDARS) transmission capabilities.

24 Claims, 5 Drawing Sheets

SINGLE PATH ARCHITECTURE AND AUTOMATIC GAIN CONTROL (SAGC) ALGORITHM FOR LOW POWER SDARS RECEIVERS

FIELD OF THE INVENTION

The present invention relates to automatic gain control in radio receivers, and particularly to automatic gain control in digital radio receivers adapted for receiving multiple types of signal using a single path of radio frequency and intermediate frequency (RF/IF) front end and a single analogue-to-digital converter.

BACKGROUND OF THE INVENTION

Satellite digital audio radio services (SDARS) broadcast audio programming directly from a satellite to an end user's radio receiver, so that a typical SDARS broadcast reaches an extensive, diverse, geographical region. In order to ensure high quality, uninterrupted transmission in all the reception regions reached by the broadcast, SDARS providers typically complement their satellite broadcast with gap-filling rebroadcasts using terrestrial stations located in regions having poor or no satellite reception, such as cities with tall buildings. The signals broadcast from the satellite and by the terrestrial stations contain the same audio data, and are typically on adjacent frequencies but use different modulation techniques. The terrestrial signals are also typically broadcast at significantly higher signal strength, primarily because terrestrial stations have easy access to electrical power while satellites are limited to the electrical power available from their solar panels.

An exemplary SDARS system is the service provided by Sirius Radio Systems of New York, N.Y., which broadcasts over 100 channels of audio programming directly from satellites to users equipped with appropriate receivers.

FIG. 1 shows the relative frequencies and power levels of the signals in the Sirius system. Two geo-synchronous satellites transmit S band (2.3 GHz), time division multiplexed (TDM) signals directly to the end user's receiver, which is typically a mobile receiver in an automobile or a truck. In regions with poor satellite reception, terrestrial repeater stations broadcast a coded orthogonal frequency division multiplexed (COFDM) signal containing the same audio data as that broadcast in the satellite signals. The terrestrial COFDM signals are broadcast at an S band frequency, lying between the frequencies of the two satellite TDM signals, and at a significantly higher power level.

FIG. 2 shows a schematic diagram of a prior art, digital radio receiver designed to receive and decode the audio channels contained in the Sirius system signals. The receiver 10 has two decoding circuits 12 and 14, one for receiving TDM signals directly from the satellites and one for receiving COFDM signals. The TDM decoding circuit has a TDM antenna 16 for receiving the signal, which is then amplified by TDM variable gain amplifier (VGA) 18. The amplified signal is digitized by a TDM analogue-to-digital converter (ADC) 20. The digitized TDM signals are down-converted by TDM digital-down-converter (DDC) 22, before being demodulated. In the Sirius system, there are two geo-synchronous satellites visible at any one time, so there are two TDM demodulators 24 and 26, one for handling each of the signals.

The ADC 20, which is typically a 10 bit device with a usable dynamic range of about 52 dB, plays an important role in digital radio reception. As long as the digitized signal is an accurate representation of the incoming analogue signal, digital filtering techniques make it possible to extract very weak signals, such as those received from a satellite, even in the presence of a significant amount of noise. Accurate digitization requires that the incoming signal is amplified sufficiently to fill as much of the ADC's dynamic range as possible. It is, however, also very important not to over amplify the incoming signal since, when the ADC is overdriven and overflows, a small signal in a noisy background can be completely lost. This happens because the ADC simply truncates any excess signal.

The appropriate gain setting of VGA 18 that amplifies the incoming signal to the optimal level for the ADC is controlled by the TDM automatic gain control (AGC) 28. The AGC monitors the demodulated TDM signals, and uses the stronger of the two demodulated TDM signals to set the gain of VGA 18 so that the portion of the received signal containing the best TDM signal is amplified appropriately, and a constant level output is obtained.

Any available COFDM signal is demodulated using a parallel COFDM decoding circuit 14, having COFDM antenna 30, VGA 32, ADC 34, COFDM 36, COFDM demodulator 38, and COFDM AGC 40. All the demodulated signals are summed together in sum module 42.

In prior art receivers designed for the Sirius system, the front end of both the TDM and the COFDM decoding circuits contain substantially identical components, i.e., the TDM and COFDM antennas 16 and 30, VGAs 18 and 32 and ADCs 20 and 34 are the same as each other. In order to reduce the power requirements and the cost of receivers, it is highly desirable to have a receiver with only one front-end, i.e., only one antenna 16, one VGA 18 and one analogue-to-digital converter (ADC) 20, as shown schematically in FIG. 3.

Practical implementation of a single front-end circuit of the type shown in FIG. 3 is not, however, simple. A major problem in such a circuit is that the VGA gain settings for the two types of signal may be incompatible with each other. This causes difficulties if the VGA gain is controlled using a simple, two-state AGC 43, with one state to optimize the gain for a COFDM signal and one state to optimize the VGA gain for a TDM signal. In such a system, a VGA gain that is optimal for the weak TDM signals from the satellite will typically over-amplify the incoming COFDM signal from the terrestrial stations, resulting in the COFDM signal over-flowing the ADC's dynamic range. This over-flow of the ADC's dynamic range means that the demodulated COFDM audio data is of very poor quality, and may even be non-existent. The receiver may also be blocked from reception of the TDM signal.

Similarly, if the VGA gain setting is optimal for the ADC to digitize the portion of the signal containing the stronger, COFDM signal, the portion of the signal containing the TDM signal will be under-amplified, and poorly digitized by the ADC. The result is that if the receiver does lock on to a terrestrial COFDM signal, it may stay locked onto the terrestrial signal, even if there is a better satellite signal available.

In order to achieve the highly desirable power and cost savings that a single VGA and ADC would provide, it is necessary to have an automatic gain control that can adjust the VGA gain in a way that makes it possible to use the best available signal, and not to be blinded to the availability of a better signal by either under or over amplifying any portion of the signal with respect to the ADC dynamic range.

SUMMARY OF THE INVENTION

The present invention provides automatic gain control (AGC) methods and apparatus for use in a digital radio receiver that allows at least two types of input signal to be processed using a single receiver front end, i.e., a single antenna, VGA and analogue-to-digital converter (ADC) combination, that is common to the decoding circuits used for all types of signal.

In a preferred embodiment, the AGC of this invention enables single front-end processing of two different signal types by supporting two modes of operation, each optimized for supporting one particular signal type, and a third mode of operation which is capable of supporting both modes, but is not optimized for either. The AGC enables the receiver to switch between the optimized modes of operation via the non-optimized mode, thereby allowing for smooth transitions between the optimized modes of operation.

In a preferred embodiment of the present invention, the AGC monitors the demodulated output of each signal type, and by comparing the signal strengths, makes transitions between the three modes of operation. In particular, the AGC measures the difference between the strength of the demodulated signals of each type of signal. This difference is compared to two preset, threshold values. If, while the receiver is in the third, non-optimized mode of operation, this difference has a value that is between the two threshold values, the receiver remains in the third, non-optimized mode of operation. If, however, while the system is in this third mode of operation, the difference has a value that is less than the first, lower threshold value, the system transitions to a first mode of operation optimized for the first type of signal. If, while the system is in this first mode of operation, the difference exceeds the first threshold value, the system transitions back to the third mode of operation. Similarly, if, while the system is in this third mode of operation, the difference is above the second, higher threshold value, the receiver transitions to a second mode of operation optimized for the second type of signal. If, while the system is in this second mode of operation, the difference falls below the second threshold value, the receiver transitions back to the third mode of operation.

In a preferred embodiment of the invention, in each mode of operation, the AGC adjusts the gain of a VGA so that an incoming signal is amplified to a level that is suitable for an analogue-to-digital (ADC) converter to convert the required signal type to a digital form.

These and other features of the invention will be more fully described by references to the following drawings.

DETAILED DESCRIPTION

Figure 1:
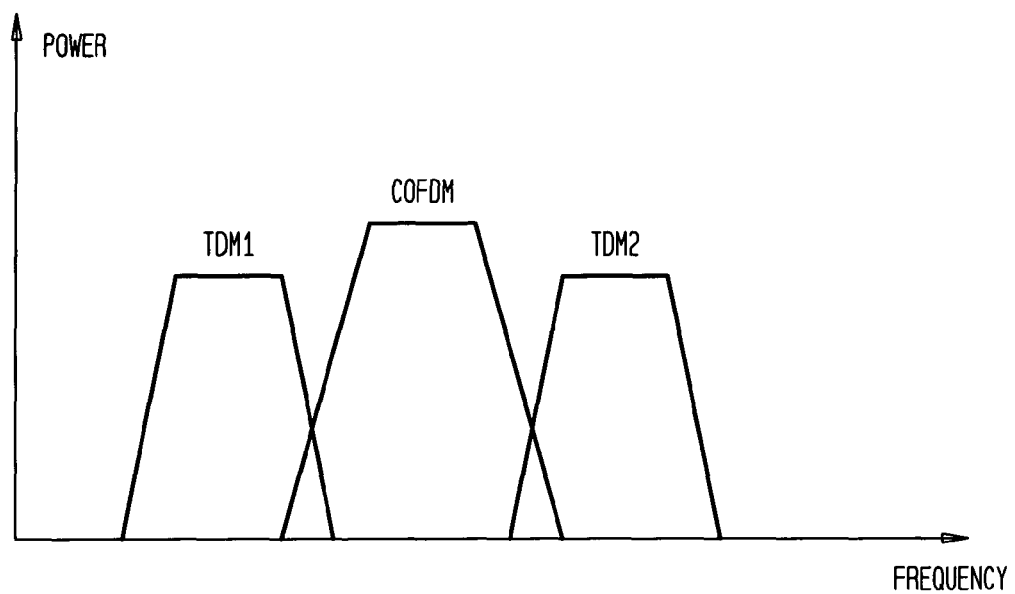
FIG. 1 shows the relative frequencies and power levels of the signals in an exemplary satellite digital audio radio (SDARS) system.
Figure 2:
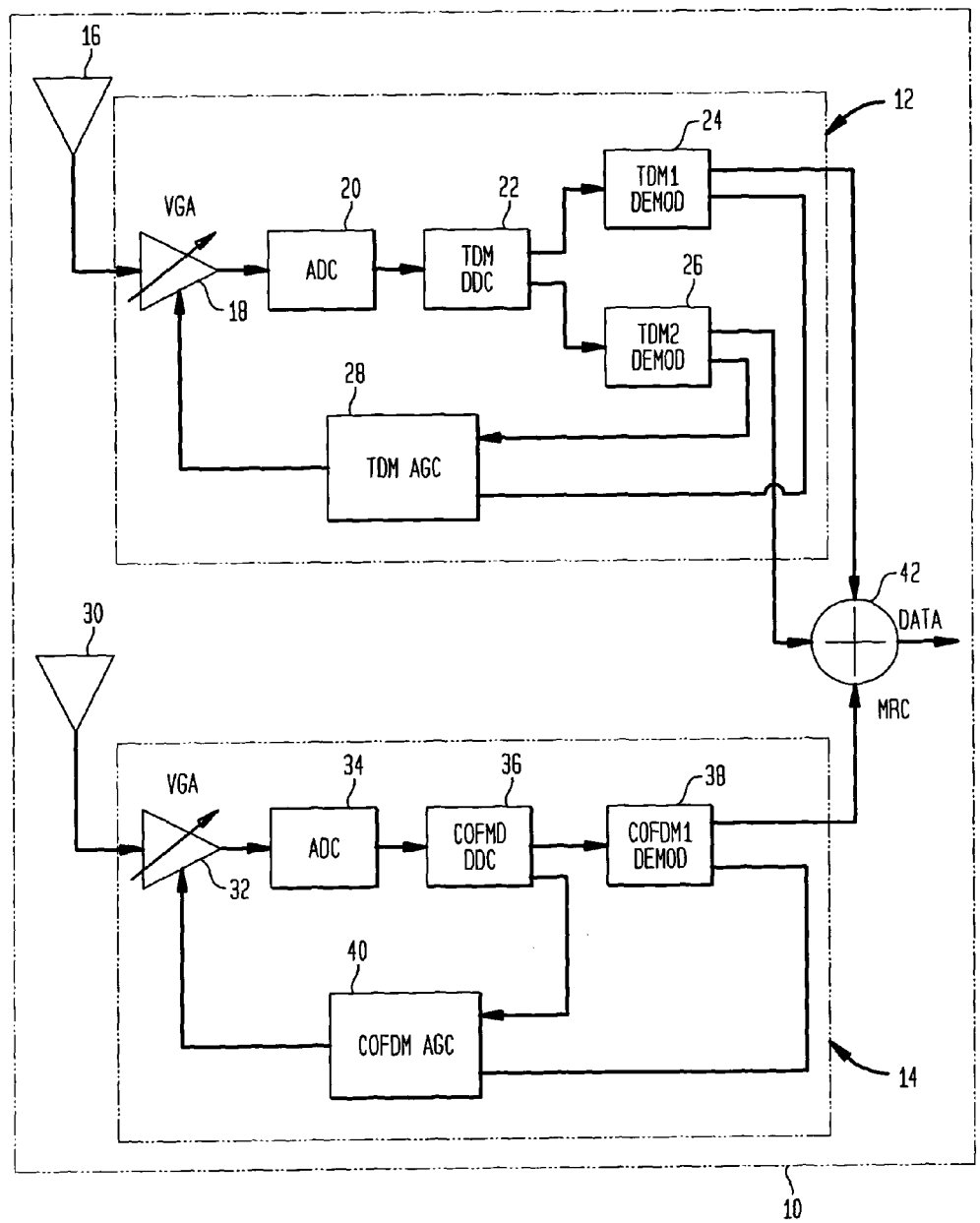
FIG. 2 is a schematic diagram of a digital radio receiver designed to receive and decode the audio channels contained in the exemplary SDARS system of FIG. 1.

The present invention provides an automatic gain control (AGC) that enables a digital radio having a single front-end to process multiple, different input signals. The AGC does this by having a number of modes of operation, each characteristic of a specific reception environment that the receiver may be used in, and a decision making algorithm for switching among these modes of operation.

In a preferred embodiment of the invention, a digital radio receiver having a single front-end, i.e., a single antenna, a single path of VGA, and a single analogue-to-digital converter (ADC), and a plurality of back-ends, i.e., a plurality of digital down converters (DDC) and digital demodulators, is controlled by means of a single AGC. The AGC is capable of setting and maintaining the gain of the VGA so that the signal at its output can be maintained at a plurality of set points. Each set point is chosen for substantially optimal decoding of the types of signal typically available to the receiver in a particular reception environment. The AGC is further capable of monitoring and comparing the demodulated signals of each of the plurality of receiver back-ends, and using the comparison to decide whether to transition to another set point. In particular, the AGC of the present invention avoids having the receiver either lock onto a poor signal because a better signal is under-amplified at a particular set point, or being blinded to a better signal because a poorer signal is over-flowing the ADC at a particular set point. In this way, the AGC ensures that the best available signal is used at all times.

The AGC of the present invention is particularly suited to use in satellite digital audio radio (SDARS) systems, particularly those in which a gap-filling terrestrial repeater broadcasts a complementary signal containing the same audio data, as it allows the use of single VGA and ADC, thereby considerably reducing the cost and power requirements of such receivers. Furthermore, the AGC system and method is compatible with existing SDARS transmission capabilities. Such a terrestrial repeater typically broadcasts on a frequency adjacent to the satellite broadcast signal, but using a different modulation method and at a significantly different signal strength.

A typical SDARS transmission system, which includes two visible satellites and also gap-filling terrestrial repeaters in some locations, has at least four environments in which a receiver has to operate.

A first environment is open space, where satellite reception is good and there are no repeater stations, such as in a flat rural area. In this first environment, only satellite broadcast signals are available and the receiver has to select only which satellite broadcast signal is the best to use.

A second environment is a region with poor or no satellite reception, but with good terrestrial reception. An example of such an environment is New York City, where the tall buildings block satellite reception. In such a region, the radio receiver only needs to decode the terrestrially broadcast signal.

A third environment is a transition region in which signals from both a satellite and from a terrestrial repeater are available at acceptable signal strengths. An example of such a region is the beltway around Washington, D.C. In such a region, the radio receiver has to choose which signal provides the best quality audio data after decoding.

A fourth environment is a region where the satellite broadcast signal is poor or non-existent and the terrestrial reception is poor. An example of such a region is Newark, N.J., where the buildings are tall enough to make satellite reception problematic but which is not adequately served by terrestrial broadcast stations.

A preferred embodiment of the invention comprises an AGC having four operational modes. Each operational mode provides substantially optimal decoding of the SDARS signals available to the receiver in one of the four reception environments detailed above. Such an AGC will now be described in detail by reference to the accompanying figures, in which, as far as possible, like numbers represent like elements.

Figure 4:
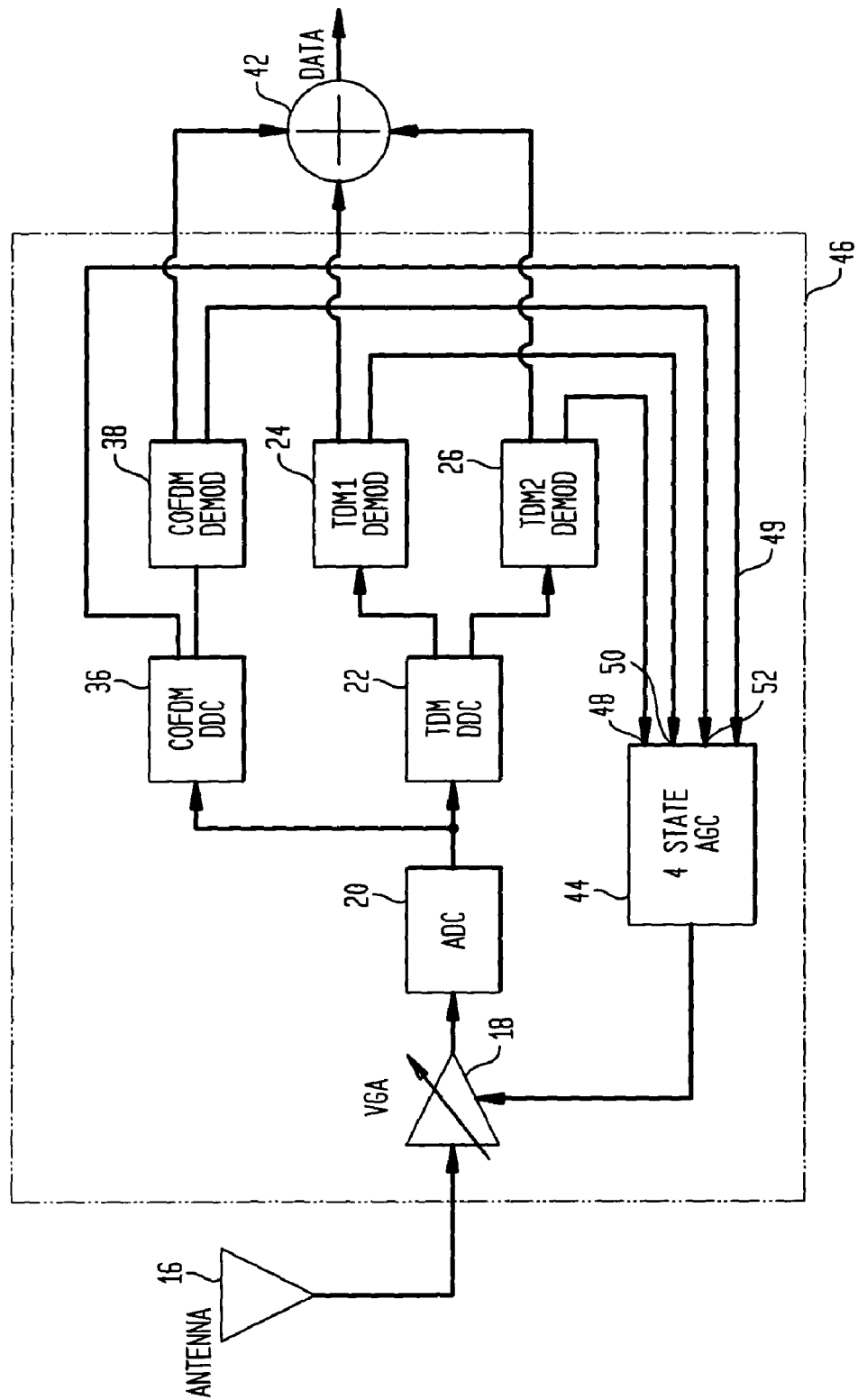
FIG. 4 is a schematic diagram of a digital radio receiver having a single front-end and being capable of receiving and decoding the audio channels contained in the exemplary SDARS system of FIG. 1, but having a four-state AGC.

FIG. 4 is a schematic diagram of a digital radio receiver having a single front-end and being capable of receiving and decoding the audio channels contained in the exemplary SDARS system of FIG. 1, and in which the VGA gain is controlled by a four-state AGC. The digital radio receiver 46 comprises an antenna 16, a VGA 18, an analogue-to-digital converter 20, a COFDM digital down converter (DDC) 36, a COFDM demodulator 38, a TDM DDC 22, a first TDM demodulator 24, a second TDM demodulator 26, a signal mixer 42 and a single path Automatic Gain Control (SAGC) 44. The SAGC 44 comprises monitor inputs, including COFDM demodulator output monitor line 52, COFDM DDC pre-filter power output line 49, TDM1 monitor line 50 and TDM2 monitor line 48.

The COFDM demodulator output monitor line 52 contains two signals, the post-filter power of the COFDM signal, P0, and the COFDM track signal that indicates whether or not any COFDM signal is currently being tracked.

The TDM1 demodulator output monitor line 50 also contains two signals, the power of the TDM1 signal, P1, and the TDM1 track signal that indicates whether or not any TDM1 signal is currently being tracked.

Similarly, the TDM2 demodulator output monitor line 48 contains two signals, the power of the TDM2 signal, P2, and the TDM2 track signal that indicates whether or not any TDM2 signal is currently being tracked.

AGC 44 sets the gain of VGA 18 based on the monitored signals.

The digital radio receiver 46 is comprised of electronic circuits that are well known in the art and can be manufactured by well known electronic component techniques, or implemented entirely, or in part, on general purpose computing and control devices such as, but not limited to, digital signal processors.

Figure 3:
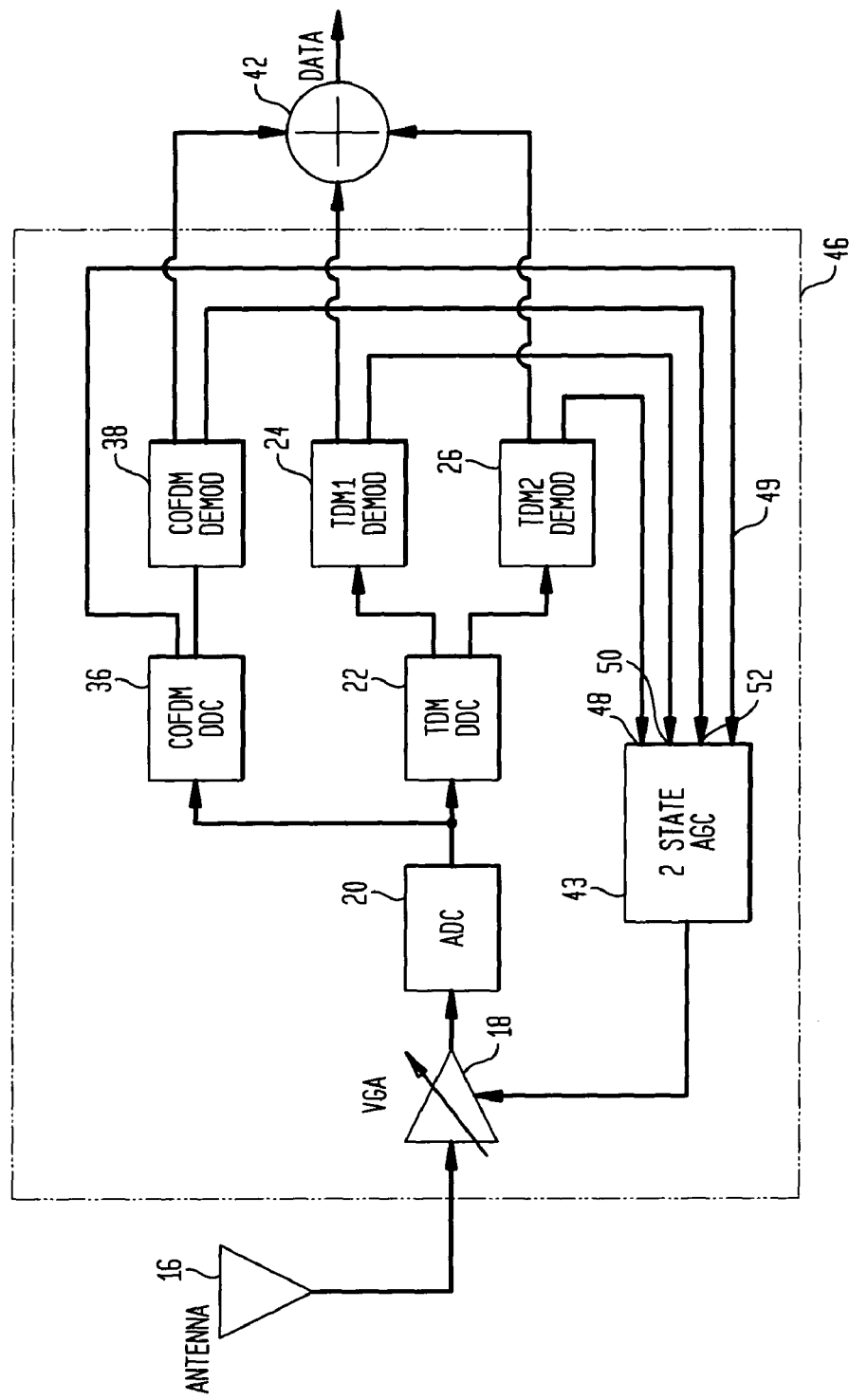
FIG. 3 is a schematic diagram of a digital radio receiver having a single front-end and being capable of receiving and decoding the audio channels contained in the exemplary SDARS system of FIG. 1, but having a two-state AGC.
Figure 5:
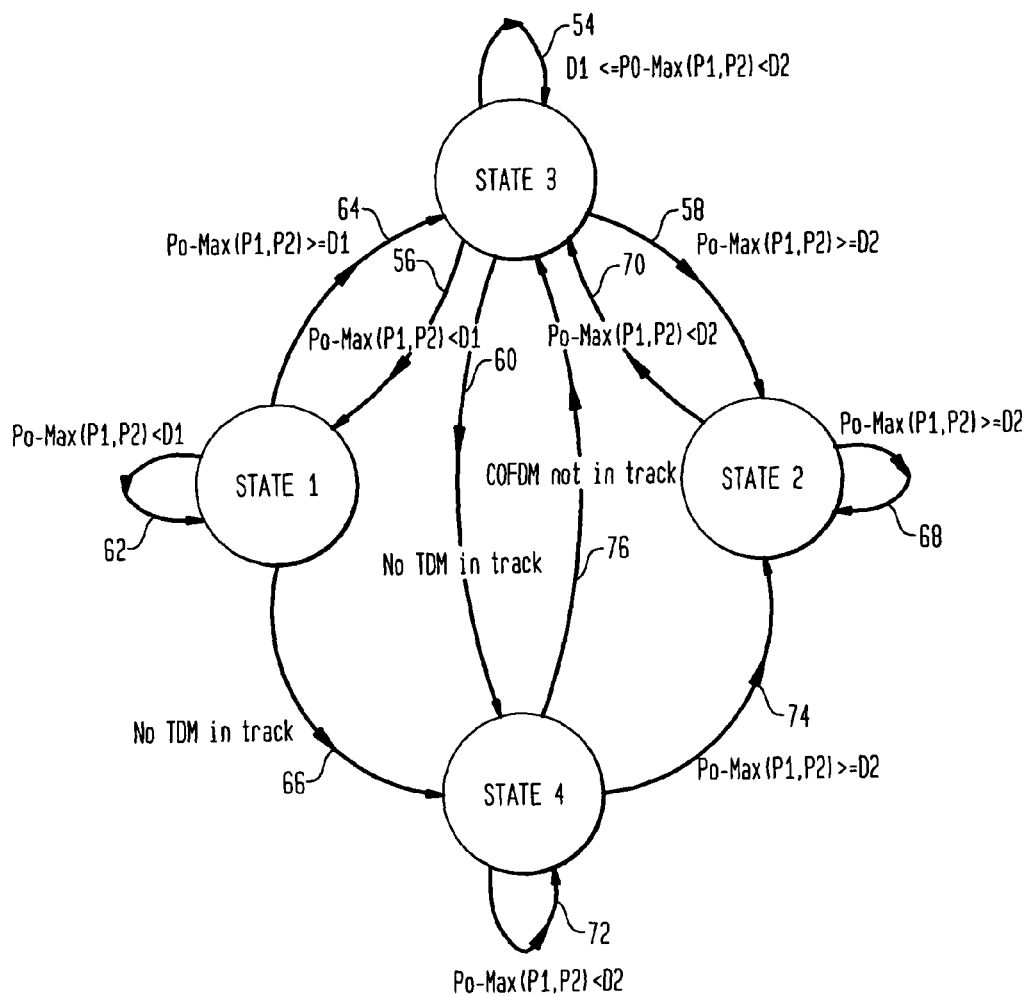
FIG. 5 is a state-transition diagram for a single path automatic-gain-control (AGC) suitable for controlling a single front-end digital radio receiver of the type shown in FIG. 3.

FIG. 5 is a state-transition diagram for a single path automatic-gain-control (AGC) suitable for controlling the single front-end digital radio receiver of FIG. 3. The state transition diagram comprises four distinct states of operation, States 1-4. These four states correspond to the reception conditions detailed above.

In State 1, the AGC 44 sets the gain of VGA 18 to substantially optimize processing of the signal expected in the first reception environment, so as to yield the most accurate data after decoding. In a preferred embodiment, in State 1, the VGA gain is set to substantially optimally amplify a TDM signal received from a satellite.

In State 2, the AGC 44 sets the gain of VGA 18 to substantially optimize processing of the signal expected in the second reception environment, so as to yield the most accurate data after decoding. In a preferred embodiment, in State 2, the VGA gain is set to substantially optimally amplify a COFDM signal received from a terrestrial broadcast station.

In State 3, the AGC 44 sets the gain of VGA 18 to process both types reasonably, so as to yield acceptable data from both signals after decoding. In a preferred embodiment, the AGC sets the gain of VGA 18 to an intermediate or compromise value that substantially ensures that both a TDM signal received from a satellite and a COFDM signal received from a terrestrial broadcast station will yield usable audio data after decoding.

In State 4, the AGC 44 sets the VGA gain to optimize the demodulation of the COFDM signal in order to operate in the environment in which there is no satellite broadcast signal and the terrestrial signal is weak. Although the VGA gain in State 4 is the same as State 2, it is shown as a separate state because the conditions for transitioning into and out of State 4 are different from those for transitioning into and out of State 2, as described in detail below.

In a preferred embodiment, the transitions between the four states are managed according to the transition rules diagramed in FIG. 4. In particular, AGC 44 calculates a difference between the power level P0 of the demodulated, terrestrial COFDM signal, and the greater of power levels P1 and P2. (P1 and P2 are the power levels of the demodulated, satellite broadcast TDM signals). This difference is then compared with two preset threshold values, a lower value D1 and an upper value D2. Depending on this comparison, and on which state the receiver is currently operating, various transitions are made.

In a preferred embodiment, if receiver 46 is operating in the State 3 mode in which the AGC is set to a compromise value to allow reasonable decoding of both types of signal, and the difference is less than the upper value D2, and greater than, or equal to, the lower threshold value D1, the receiver 46 continues to operate in the State 3 mode, as indicated by transition 54. If the receiver is in the State 3 mode and the difference falls below lower threshold D1, AGC 44 transitions receiver 46 along transition 56 to operate in the State 1 mode, optimized for demodulating data contained in a satellite broadcast TDM signal. Other transitions from the State 3 mode of operation include: the transition 58, in which the difference is greater than, or equal to, the upper threshold value and therefore transitions to State 2, in which the AGC 44 optimizes for a COFDM signal; and transition 60, in which the AGC 44 detects no TDM track signal and therefore transitions to State 4, in which the AGC 44 optimizes for a COFDM signal.

The transitions from the State 1 mode of operation, in which the AGC optimizes for a TDM signal, include: the transition 62, of remaining in State 1 mode if the difference is less than lower threshold D1; the transition 64 to the State 3 mode of operation, in which the AGC 44 uses a compromise setting to allow reasonable decoding of both a TDM and a COFDM signals, if the difference is greater than or equal to the lower threshold D1; and the transition 66 to the State 4 mode of operation, in which the AGC 44 optimizes for a COFDM signal, if no TDM track signal is detected.

The transitions from the State 2 mode of operation, in which the AGC 44 optimizes for a COFDM signal, include: the transition 68 of remaining in the State 2 mode of operation if the difference is greater than or equal to the upper threshold value; and the transition 70 to the State 3 mode of operation, in which the AGC is set to a compromise value to allow reasonable decoding of both types of signal, if the difference falls below the upper threshold value D2.

The transitions from the State 4 mode of operation, in which the AGC 44 optimizes for a COFDM signal, include: the transition 72 of remaining in State 4 if the difference is less than the upper threshold value D2; the transition 74 to the State 2 mode of operation in which the AGC 44 uses a compromise setting to allow reasonable decoding of both a TDM and a COFDM signals, in which the AGC 44 optimizes for a COFDM signal, if the difference is greater than, or equal to, the upper threshold D2; and the transition 76 to State 3 mode of operation, in which the AGC if no COFDM track signal is detected.

In a further preferred embodiment of the invention, there is a hysteresis off-set value, i.e. a value that is different depending on the history of the system. The hysteresis off-set value is used to prevent repetitive switching when the difference value is close to the preset value. In this embodiment of the invention, the transitions between the states in one direction only occur if the difference exceeds the preset values by the amount of the hysterisis off-set value, while transitions between the same states in the opposite direction only occur if the difference is less than the preset values by the amount of the hysteresis off-set value. For instance, transition 58 from State 3 to State 2 only occurs if the difference value is greater than or equal to the preset value plus the hysteresis off-set value, while transition 70 from State 2 to State 3 only occurs if the difference is less than the preset value minus the hysteresis off-set value. This prevents repetitive switching between states 2 and 3 when the difference value is close to a preset value.

In a further preferred embodiment, there is an assurance time which is a preset time value. In this embodiment of the invention, transitions between the states, as detailed above, only occur if a transition condition is maintained for a length of time that is at least equal to the preset time value.

The states and the transitions between them may be implemented by programming a general purpose digital computing and control device such as, but not limited to, a digital signal processor or a digital micro-processor. Appendix I is a listing of computer code for implementing an exemplary embodiment of the invention on such a device, including typical, practical gain and threshold values.

In a further embodiment of the invention, the AGC may monitor other attributes of the demodulated signals including, but not limited to, the signal-to-noise ratio of the signal. Comparisons of these attributes may be used in a manner similar to the way in which power levels are used in the embodiments of the invention detailed above. For instance, a difference in the signal-to-noise ratio of the decoded satellite signal and the signal-to-noise ratio of the decoded terrestrial signal may be use to adjust the gain of the VGA according to the inventive concepts of the present invention.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

APPENDIX I

Computer code listing for an exemplary embodiment of the present invention

```
SAGC Algorithm Specification:
#define TDM 1        1
#define TDM2         2
#define COMM         0
#define UR           100    //the IF AGC update rate(Hz)
#define TIMER_INTVL         UR*2 // timer limited for 2 seconds,
#define ALPHA        0.9    //the percentage to pass the power test;
#define D1           11     // in terms of dB, can be configured to different values;
#define D2           14     // in terms of dB, can be configured to different values;
#define TDM_SetPoint_dB_A         10.4 //normal TDM set point used in state A
#define TDM_D        4      // maximal TDM Setpoint Offset in terms of dB;
#define OFDM_D       4      // maximal COMM Setpoint Offset in terms of dB;
#define OVERLAP      I      // overlap offset to reduce state transition in overlap area;
#define COMM_SetPoint_dB          32.2 //COFDM IFAGC Setpoint;
#define A    1         //three state index
#define B    2
#define C    3
#define D    4
static int State =A; // the initial SAGC FSM is in State A
static int OldState;
static int CountA=0; //Count used in FSM
static int WindowA=0; static int CountC=O; static int WindowC=O;
static int CounterD=0;
float FSM_SAGC (PI, P2, Po_Pre, Po_Post, TDM1_Track, TDM_2_Track,
COFDM_Track)
//P[1],P[2]: the post-filter TDMI and TDM2 power in dB
//Po_Pre, Po_Post: the prefilter and post-filter power of COFDM in dB
//TDMI_Track, TDM2_Track: the TDMI/2 tracking status, 1 means in track, 0 means not
in track;
//COFDM_Track: the COFDM tracking status, 1 means in track, 0 means not in track;
{
    float Delta;
    OldState = State;
    Switch(State)
    {
    case A: //TDM dominant area;
    TDM_AGC(P1, P2, TDM_SetPoint_dB_A); // call conventional TDM AGC
function;
        if( Po_Post – max(P 1, P2) <D1 + OVERLAP) //TDM area
        {
        if( CountA )
            WindowA ++;
        if ( TDM 1_Track = 0 && TDM2_Track = 0)
        {
            CountD++;
            if(CountD >=TIMER_INTVL) //no TDM in track, jump to State D
            {
                State = D; CountA=0;
                WindowA=0; CountD=0;
                break;
            }
        }
```

APPENDIX I-continued

Computer code listing for an exemplary embodiment of the present invention

```
    }else{CountD=0; //reset the counter;
    }
    else { //possible three-stream or COFDM area CountA++;
        WindowA++;
    }
    if(WindowsA >= TIMER INTVL & CountA>=ALPHA* TIMER_INTVL) //to state B {
    WindowA=0;
    CountA=0;
    State=B;
    }
    else if(WindowA >= TIMER _INTVL & CountA< ALPHA* TIMER_INTVL ) {//reset the counters;
    WindowA=0;
    CountA=0;
    break;
case B: //three-stream area, first compute the TDM AGC Setpoint;
    Delta= COFDM_SetPoint_dB - (Po_Post - max(PI, P2) + TDM SetPoint dB_A) //Difference betv
    if (Delta< OFDM-D )
        Delta= O;
    else
        Delta = Min( TDM_D, Delta - OFDM_D);
    TDM AGC(P1, P2, TDM_SetPoint_dB A+ Delta); // call the TDM AGC function
with higher set point
    if( Po_Post - max(P1, P2) ) < D1 -OVERLAP) //possible TDM area;
    { CountA++; WindowA++;}
    else if( Po_Post - max(P 1, P2) >= D2+0VERLAP ) //possible COFDM area; {
        CountC ++;
        WindowC++;
    }
    else //stay in three-stream area; {
        if ( TDMI-Track = 0 && TDM2-Track = 0)
        { CountD++;
        if(CountD >=TIMER_FP TVL) //no TDM in track, jump to State D;
        {
            State = D; CountA=0; WindowA=0;
            CountC=0; WindowC=0; CountD=0;
            Break;
        }
    } else{
        CountD=0;
    }
    if( CountA)
        WindowA++;
    If ( CountC)
        WindowC++;
    }
    if (WindowA>= TIMER_INTVL)
        {
        if(CountA >= ALPHA_TIMER_INTVL )
        { //Jump to State A; State=A;
            CountA=0; WindowA=0;
            CountC=0; WindowC=0;
        }
        else //. Reset the counters;
        {
            CountA=0;
            WindowA=0:
        }
    }
    if( WindowC>= TIMER_INTVL)
    {
        if(CountC >= ALPHA* TIMER_INTVL )
        { //to state C;
            State=C;
            CountA=0; WindowA=0;
            CountC=0; WindowC=0;
        }
        else // Reset the counters;
        {
            CountA=0
            WindowA=0;
        }
    }
    break;
case C: //COFDM dominant area;
COFDM_AGC(Po_Pre, Po_Post, COMM _SetPoint_dB) ; // call normal COFMD AGC if(
Po_Post - max(PI, P2) ) >=D2 - OVERLAP) //stay in COMM area;
{
    if( CountC }
```

APPENDIX I-continued

Computer code listing for an exemplary embodiment of the present invention

```
        WindowC++;
    }
else //possible three-stream or TDM area;
{
    CountC ++; WindowC ++;
}
if( WindowC >= TIMER_MTVL && CountC >= TIMER_INTVL*ALPHA )
//to State B
{
    State=B; //jump to three stream area;
    CountC=0:
    WindowC=0;
}
else if( WindowC >= TIMER_INTVL && CountC <TIMER-lNTVL*ALPHA )
//reset the counters,
{
    CountC=0;
    WindowC=0;
}
break;
case D: //jump from State A or B since no tracking for TDM; then SAGC tracks OFDM
COFDM_AGC(Po_Pre, Po_Post, COFDM_SetPoint_dB) ; // call normal COFMD AGC If
(COFMD TEACK==0) //COFDM not in tracking;
{
    CountA++;
    if(CountA-TIMER_INTERVAL/4) //no tracking for > 0.5 seconds; to State A;
    {
    CountA=0; CountC=0; WindowC=0;
    State = B;
    Break:
    }
}
else if(Po_Post −max(P 1,P2) >=D2 )
//OFDM power is more than D2 stronger than TDM; to State C
{
    CountC++; WindowC++:
}
else if(CountC)
    WindowC++;
if( WindowC >= TIMER-INTVL && CountC >=TIMER_INTVL*ALPHA )
//to State C
{
    State=C;
    CountC=0;
    WindowC=0;
    CountA=0;
    break;
} //end of FSM_SAGC(...);
```

What is claimed:

1. A method for operating an automatic gain control coupled to a variable gain amplifier, the automatic gain control being operable to control the variable gain amplifier in at least three modes of operation, the method comprising the steps of:
   a) operating the automatic gain control in a third mode of operation adapted for both said first signal modulation type and said second signal modulation type;
   b) comparing a first output level corresponding to said first signal modulation type to a second output level corresponding to said second signal modulation type; and
   c) transitioning the automatic gain control from said third mode to one of a first mode of operation adapted for said first signal modulation type and a second mode of operation adapted for said second signal modulation type responsive to said comparing step;
   wherein the variable gain amplifier is shared by both said first signal having the first signal modulation type and said second signal having the second signal modulation type in each of the at least three modes of operation comprising the first mode of operation adapted for said first signal modulation type, the second mode of operation adapted for said second signal modulation type, and the third mode of operation adapted for both said first signal modulation type and said second signal modulation type.

2. The method of claim 1, further comprising the steps of:
   d) transitioning the automatic gain control from said first mode of operation to said third mode of operation responsive to said comparing step; and
   e) transitioning the automatic gain control from said second mode of operation to said third mode of operation responsive to said comparing step.

3. The method of claim 2, wherein step b) comprises calculating a difference between said first output level and said second output level, and wherein step c) comprises transitioning to said first mode dependent on said difference being less than a first constant and transitioning to said second mode dependent on said difference exceeding a second constant.

4. The method of claim 3, wherein step d) occurs dependent on said difference exceeding said first constant, and step e) occurs dependent on said difference being less than said second constant.

5. The method of claim 4, wherein step c) comprises transitioning from said third mode to said first mode dependent on said difference being less than said first constant minus a preset hysteresis off-set value, and step d) comprises transitioning from said first mode to said third mode dependent on said difference exceeding said first constant plus said preset hysteresis off-set value.

6. The method of claim 2, further comprising a fourth mode of operation adapted for said second signal modulation type, a first track signal corresponding to the presence of said first signal modulation type and a second track signal corresponding to the presence of said second signal modulation type and further comprising the steps of f) transitioning from said first mode to said fourth mode dependent on said first track signal being absent; and g) transitioning from said fourth mode to said third mode dependent on said second track signal being absent.

7. The method of claim 6, further comprising the step of h) transitioning from said third mode to said fourth mode dependent on said first track signal being absent.

8. The method of claim 1, wherein step c) further comprises delaying transitioning for a preset time after a transition condition is initially established.

9. The method of claim 1, wherein the output level of a given signal modulation type comprises power of the given signal modulation type after demodulation.

10. The method of claim 1, wherein said first signal modulation type comprises a time division multiplexed (TDM) signal and said second signal modulation type comprises a coded orthogonal frequency division multiplexed (COFDM) signal.

11. A device, comprising:
an automatic gain control coupled to a variable gain amplifier, the automatic gain control being operable to control the variable gain amplifier in at least three modes of operation; and
a processor programmed to be capable of:
operating said automatic gain control in a third mode of operation adapted for both the first signal modulation type and the second signal modulation type;
comparing a first output level corresponding to said first signal modulation type to a second output level corresponding to said second signal modulation type; and
transitioning said automatic gain control from said third mode to one of a first mode of operation adapted for said first signal modulation type and a second mode of operation adapted for use in connection with said second signal modulation type responsive to said comparing step;
wherein the variable gain amplifier is shared by both said first signal having said first signal modulation type and said second signal having said second signal modulation type in each of the at least three modes of operation comprising the first mode of operation adapted for said first signal modulation type, the second mode of operation adapted for said second signal modulation type, and the third mode of operation adapted for both said first signal modulation type and said second signal modulation type.

12. The device of claim 11, wherein said processor is further capable of transitioning said automatic gain control from said first mode of operation to said third mode of operation responsive to said comparison; and transitioning said automatic gain control from said second mode of operation to said third mode of operation responsive to said comparison.

13. The device of claim 12, wherein said processor is further capable of calculating a difference between said first output level and said second output level, and wherein said transitioning said automatic gain control from said third mode of operation to said first mode of operation occurs dependent on said difference being less than a first constant and said transitioning said automatic gain control from said third mode of operation to said second mode dependent on said difference exceeding a second constant.

14. The device of claim 13, wherein said processor is further capable of transitioning said automatic gain control from said first mode of operation to said third mode of operation dependent on said difference exceeding said first constant, and transitioning said automatic gain control from said second mode of operation to said third mode of operation dependent on said difference being less than said second constant.

15. The device of claim 13, wherein said processor is further capable of transitioning said automatic gain control from said third mode to said first mode dependent on said difference being less than said first constant minus a preset hysteresis off-set value, and transitioning said automatic gain control from said first mode to said third mode dependent on said difference exceeding said first constant plus said preset hysteresis off-set value.

16. The device of claim 12, wherein said automatic gain control further comprises a fourth mode of operation adapted for said second signal modulation type, a first track signal corresponding to the presence of said first signal modulation type and a second track signal corresponding to the presence of said second signal modulation type and wherein said processor is further capable of transitioning said automatic gain control from said first mode of operation to said fourth mode of operation dependent on said first track signal being absent; and transitioning said automatic gain control from said fourth mode of operation to said third mode of operation dependent on said second track signal being absent.

17. The device of claim 16, wherein said processor is further capable of transitioning said automatic gain control from said third mode of operation to said fourth mode of operation dependent on said first track signal being absent.

18. The device of claim 11, wherein said processor is further capable of storing a preset time value, and wherein said transitioning is dependent on said comparison maintaining a transition condition for a time at least equal to said preset time value.

19. The device of claim 11, wherein the output level of a given signal modulation type comprises power of the given signal type after demodulation.

20. The device of claim 11, wherein said first signal modulation type comprises a time division multiplexed (TDM) signal and said second signal modulation type comprises a coded orthogonal frequency division multiplexed (COFDM) signal.

21. The device of claim 11, wherein the variable gain amplifier is in a receiver front-end shared by both said first signal having said first signal modulation type and said second signal having said second signal modulation type in each of the at least three modes of operation, and wherein the shared receiver front-end further comprises an antenna coupled to the variable gain amplifier and shared by both said first signal having said first signal modulation type and said second signal having said second signal modulation type in each of the at least three modes of operation.

22. The device of claim 21, wherein the shared receiver front-end further comprises a analogue-to-digital converter shared by both said first signal having said first signal modulation type and said second signal having said second signal modulation type in each of the at least three modes of operation.

23. The device of claim 21, wherein the shared receiver front-end is coupled to at least first and second receiver back-ends respectively corresponding to the first signal modulation type and the second signal modulation type.

24. The device of claim 23, wherein the first receiver back-end comprises one or more digital down converters corresponding to the first signal modulation type and one or more digital demodulators corresponding to the first signal modulation type, and wherein the second receiver-back end comprises one or more digital down converters corresponding to the second signal modulation type and one or more digital demodulators corresponding to the second signal modulation type.

* * * * *